(12) United States Patent
Hodot et al.

(10) Patent No.: US 11,300,332 B2
(45) Date of Patent: Apr. 12, 2022

(54) THERMAL CONTROL DEVICE OF A COMPONENT, ASSOCIATED ELECTRONIC SYSTEM AND PLATFORM

(71) Applicant: THALES, Courbevoie (FR)

(72) Inventors: Romain Hodot, Valence (FR); Claude Sarno, Valence (FR)

(73) Assignee: THALES, Courbevoie (FR)

( * ) Notice: Subject to any disclaimer, the term of this patent is extended or adjusted under 35 U.S.C. 154(b) by 198 days.

(21) Appl. No.: 16/232,779

(22) Filed: Dec. 26, 2018

(65) Prior Publication Data

US 2019/0203982 A1 Jul. 4, 2019

(30) Foreign Application Priority Data

Dec. 28, 2017 (FR) ..................... 1701388

(51) Int. Cl.
*F25B 21/02* (2006.01)
*G01P 1/02* (2006.01)
(Continued)

(52) U.S. Cl.
CPC .............. *F25B 21/02* (2013.01); *G01P 1/023* (2013.01); *G05D 23/1919* (2013.01);
(Continued)

(58) Field of Classification Search
CPC .................. F25B 21/02; F25B 2321/02; F25B 2321/021; F25B 2321/023; F25B 2321/0212; F25B 2321/025; F25B 21/04
See application file for complete search history.

(56) References Cited

U.S. PATENT DOCUMENTS 5,117,638 A * 6/1992 Feher ................. A47C 7/74
165/104.21
5,515,682 A 5/1996 Nagakubo et al.
(Continued)

FOREIGN PATENT DOCUMENTS

CN 101297600 A 10/2008
CN 101463984 A 6/2009
(Continued)

OTHER PUBLICATIONS

Maciá-Barber, E.Thermoelectric Materials Advances and Applications, Taylor & Francis Group, LLC, p. 29, 2015.*
(Continued)

*Primary Examiner* — Brian M King
(74) *Attorney, Agent, or Firm* — ArentFox Schiff LLP

(57) ABSTRACT

The present invention relates to a thermal control device of a component, the control device including: a power source, a converter able to convert a temperature variation into a resistance variation, and a cooling module including two faces, a first face at a first temperature and a second face at a second temperature, the difference between the first temperature and the second temperature depending on the current supplying the cooling module, the first face being in, contact with the component, the cooling module, the converter and the power source being arranged electrically so that the current supplying the converter decreases with a temperature increase and the current supplying the cooling module remains constant.

11 Claims, 4 Drawing Sheets

(51) Int. Cl.
*H01L 35/32* (2006.01)
*G05D 23/19* (2006.01)
*G05D 23/24* (2006.01)

(52) U.S. Cl.
CPC ............. *G05D 23/24* (2013.01); *H01L 35/32* (2013.01); *F25B 2321/0212* (2013.01)

(56) References Cited

U.S. PATENT DOCUMENTS

| | | | | | |
|---|---|---|---|---|---|
| 5,687,573 | A | * | 11/1997 | Shih .................... | B60H 1/00478 62/244 |
| 5,704,213 | A | * | 1/1998 | Smith ................ | G05D 23/1934 62/3.7 |
| 6,443,003 | B1 | * | 9/2002 | Bailis ...................... | G01F 1/684 73/204.12 |
| 6,487,864 | B1 | * | 12/2002 | Platt ........................ | F25B 21/02 62/3.2 |
| 6,557,353 | B1 | * | 5/2003 | Fusco ...................... | F25B 21/02 62/3.2 |
| 6,711,904 | B1 | * | 3/2004 | Law ........................ | F25B 21/02 257/E23.08 |
| 2003/0157721 | A1 | * | 8/2003 | Turner ................ | B01L 3/50853 436/148 |
| 2004/0028099 | A1 | * | 2/2004 | Hongo .................. | G02F 1/0123 372/38.02 |
| 2004/0200226 | A1 | * | 10/2004 | Hara .................... | G03F 7/70708 62/3.2 |
| 2006/0159141 | A1 | * | 7/2006 | Uchida ............... | H01S 5/02415 372/34 |
| 2007/0177151 | A1 | * | 8/2007 | Isomura ................ | H04L 27/223 356/477 |
| 2008/0173022 | A1 | * | 7/2008 | Petrovski ............. | B60N 2/5628 62/3.2 |
| 2009/0251025 | A1 | * | 10/2009 | Kondou .................. | A61B 8/58 310/316.01 |
| 2009/0293500 | A1 | * | 12/2009 | Chen ....................... | G05D 23/24 62/3.7 |
| 2011/0006124 | A1 | * | 1/2011 | Kai ..................... | G05D 23/1919 236/46 R |
| 2012/0042661 | A1 | * | 2/2012 | Danenberg .............. | H01L 35/32 62/3.2 |
| 2012/0087384 | A1 | * | 4/2012 | Zayer ...................... | G06F 1/206 372/34 |
| 2012/0151940 | A1 | * | 6/2012 | Uratani .............. | G05D 23/1919 62/3.7 |
| 2012/0198859 | A1 | * | 8/2012 | Sepulveda .......... | F28D 15/0275 62/3.1 |
| 2012/0312029 | A1 | * | 12/2012 | Brehm .................. | F24H 3/0429 62/3.3 |
| 2014/0137569 | A1 | * | 5/2014 | Parish ...................... | F25B 21/02 62/3.2 |
| 2014/0165609 | A1 | * | 6/2014 | Oh ...................... | B60H 1/00478 62/3.61 |
| 2014/0264339 | A1 | * | 9/2014 | Kim ........................ | H01L 23/36 257/48 |
| 2015/0144299 | A1 | * | 5/2015 | Nazareth ................ | B65D 81/38 165/61 |
| 2015/0247656 | A1 | * | 9/2015 | Parish .................. | A47C 21/044 62/3.5 |
| 2015/0323228 | A1 | * | 11/2015 | Wang .................. | B60H 1/00478 62/3.7 |
| 2016/0126438 | A1 | * | 5/2016 | Marc ....................... | H01L 35/10 136/204 |
| 2016/0178264 | A1 | * | 6/2016 | Obbard ................. | F25D 11/003 53/440 |
| 2016/0246340 | A1 | * | 8/2016 | Campagna ........... | G05B 19/406 |
| 2016/0252313 | A1 | * | 9/2016 | Ziegltrum ............... | F28F 27/00 165/301 |
| 2017/0001467 | A1 | * | 1/2017 | Kim ...................... | B43K 29/02 |
| 2017/0052133 | A1 | * | 2/2017 | Opdahl ................. | G01N 21/648 |
| 2017/0135902 | A1 | * | 5/2017 | Scully, Jr. .................. | A61J 1/18 |
| 2017/0150645 | A1 | * | 5/2017 | Huang ................. | G02B 6/4278 |
| 2017/0176062 | A1 | * | 6/2017 | Qazi ....................... | F25B 49/00 |
| 2017/0191710 | A1 | * | 7/2017 | Thao ....................... | F25B 49/00 |
| 2017/0211854 | A1 | * | 7/2017 | Crocco .................... | B01L 7/52 |
| 2017/0215936 | A1 | * | 8/2017 | Wallace ................. | A61B 18/082 |
| 2017/0242048 | A1 | * | 8/2017 | Sommer .................. | G01P 15/02 |
| 2017/0276409 | A1 | * | 9/2017 | Kantor .............. | B65D 81/3897 |
| 2017/0328608 | A1 | * | 11/2017 | Benedict ................. | F25C 1/147 |
| 2017/0328609 | A1 | * | 11/2017 | Benedict ............ | A47L 15/4287 |
| 2018/0226557 | A1 | * | 8/2018 | Gruenwald ............ | D06F 58/20 |

FOREIGN PATENT DOCUMENTS

| | | |
|---|---|---|
| CN | 102447216 A | 5/2012 |
| CN | 102656533 A | 9/2012 |
| EP | 2072894 A2 | 6/2009 |
| FR | 2518282 A1 | 6/1983 |
| GB | 2317018 A | 3/1998 |
| GB | 2317018 B | 8/2000 |
| WO | 2007/001291 A2 | 1/2007 |
| WO | WO 2007/001291 A3 | 1/2007 |

OTHER PUBLICATIONS

French Search Report, issued by the French Patent Office in counterpart French Application No. 1701388, dated Sep. 6, 2018.

* cited by examiner

THERMAL CONTROL DEVICE OF A COMPONENT, ASSOCIATED ELECTRONIC SYSTEM AND PLATFORM

CROSS REFERENCE TO RELATED APPLICATIONS

The present patent application claims priority of FR 1701388 which is hereby incorporated by reference.

BACKGROUND OF THE INVENTION

Field of the Invention

The present invention relates to a thermal control device of a component. The present invention also relates to an electronic system and a platform including such a system.

In the avionics field, measuring flight parameters is a very important measurement to make sure that the airplane is indeed following a trajectory that is often predefined. Flight parameters are measured using inertial sensors.

However, due to the temperature variation of the airplanes during flight, the inertial sensors experience bias due to the temperature gradient, which is detrimental to the measurement of the flight parameters. It is therefore desirable to monitor the temperature of an electronic system, and in particular a high-precision inertial sensor.

Description of Related Art

It is known, in order to control the temperature of an electronic system, in particular an oscillator, to heat the component to a high temperature.

However, such control is harmful to the performance and reliability of the electronic system. Furthermore, the control involves the regulating electronics of the temperature, which is expensive and may affect the reliability and bulk of the measuring system.

There is therefore a need for a device for controlling the temperature of a component that is more reliable and less bulky.

BRIEF SUMMARY OF THE INVENTION

To that end, proposed is a thermal control device of a component, the control device including a power supply, a converter capable of converting a temperature variation into a resistance variation, a cooling module including two faces, a first face at a first temperature and a second face at a second temperature, the difference between the first temperature and the second temperature depending on the current supplying the cooling module, the first face being in contact with the component, the cooling module, the converter and the power source being arranged electrically so that the current supplying the converter decreases with a temperature increase and the current supplying the cooling module remains constant.

According to specific embodiments, the control device comprises one or more of the following features, considered alone or according to any technically possible combinations:
- the second face is arranged to be kept at a constant temperature.
- the cooling module and the converter are arranged in parallel with the power supply.
- the converter has a resistance that increases with the temperature.
- the converter is able to convert a temperature increase into a resistance variation.
- the converter is a thermistor.
- the control device is a self-regulated device.
- the component includes a sensor and a protective housing, the housing in particular being made from ceramic, the first face being in contact with the sensor.
- the component includes a sensor and a protective housing, the housing in particular being made from ceramic, the first face being in contact with the housing.
- the converter and the faces of the cooling module are each made from ceramic.
- the second face is made from a ceramic of the PTC type.
- the sensor is a micro-electromechanical system, in particular an inertial micro-electromechanical system, for example an accelerometer or a gyrometer.

Also proposed is an electronic system including a component and a thermal control device of the component, the control device being as previously described.

The description also proposes a platform including an electronic system as previously described.

BRIEF DESCRIPTION OF THE SEVERAL VIEWS OF THE DRAWINGS

Other features and advantages of the invention will appear upon reading the following description of embodiments of the invention, provided as an example only and in reference to the drawings, which are.

DETAILED DESCRIPTION OF THE INVENTION

Figure 1:
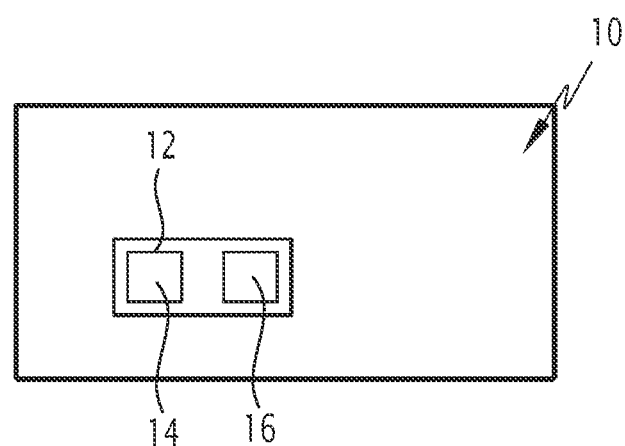
FIG. 1, a schematic view of a platform including an electronic system.

A platform 10 is illustrated in FIG. 1.

A platform 10 is either mobile like for the case of a vehicle or an aircraft or immobile like for the case of a building.

In the case of FIG. 1, the platform 10 is an aircraft.

By definition, an aircraft is a transportation means capable of rising up and moving at altitude, within the Earth's atmosphere.

Examples of aircraft include an airplane or helicopter.

The platform 10 includes an electronic system 12, the electronic system 12 including a component 14 and a thermal control device 16.

Figure 2:
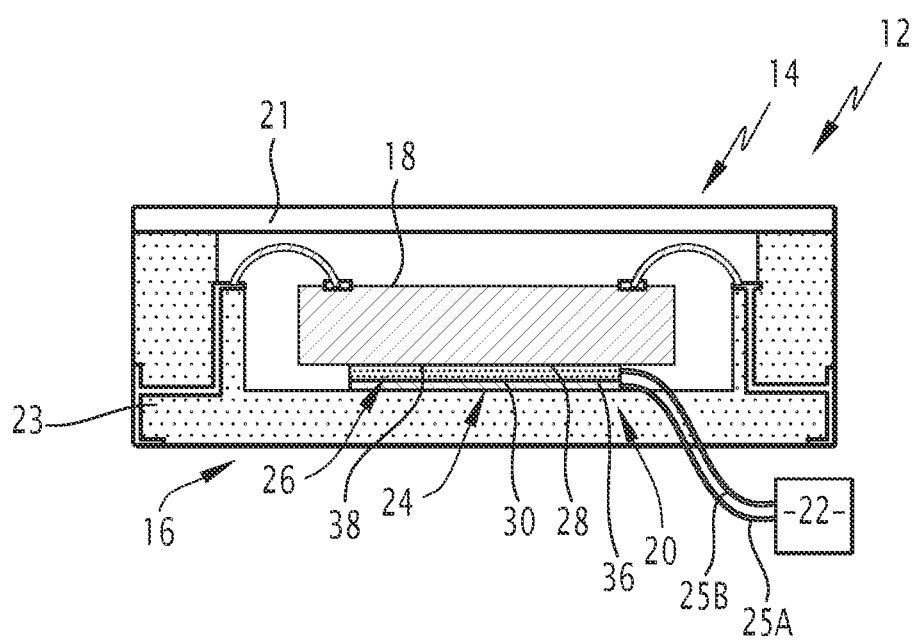
FIG. 2, an illustration of an example electronic system.

An example electronic system 12 is visible in FIG. 2.

In this example, the component 14 includes a sensor 18 and a protective housing 20.

The illustrated sensor 18 is a micro-electromechanical system.

The micro-electromechanical system is a system often referred to using the acronym MEMS referring to the English term "Microelectromechanical systems".

By definition, a micro-electrochemical system is a microsystem comprising one or more mechanical elements, using electricity as power source, in order to perform a sensor function, with at least one structure having micrometric dimensions.

As an illustration, the sensor 18 is an inertial micro-electromechanical system.

Such a sensor 18 is able to measure the measurement of the flight parameters.

For example, the sensor 18 is an accelerometer or a gyrometer.

The housing 20 is a housing intended to protect the sensor 18 from the outside environment.

In the illustrated case, the housing 20 includes a closing plate 21 and a base 23.

The closing plate 21 and the base 23 are connected to one another so that the housing 20 presents in section the form of a frame.

According to the described example, the housing 20, and in particular the base 23, is made from ceramic.

The control device 16 makes it possible to guarantee that the sensor 18 remains substantially at the same temperature, a temperature that is potentially lower than the ambient temperature.

Since the control device 16 has no temperature control electronics, the control device 16 is a self-regulated device for keeping the sensor 18 at a temperature.

The control device 16 includes a power supply 22, a converter 24 and a cooling module 26.

According to the described example, the power supply 22 is capable of delivering a constant current. As an illustration, the power supply 22 is a current generator.

The power supply 22 supplies the converter 24 via a first link 25A and the cooling module 26 via a second link 25B.

According to an alternative that is not shown, the power supply 22 is distributed into two separate supplies, one supply connected to the converter 24 and the other supply connected to the cooling module 26.

The converter 24 is able to convert a temperature variation into a resistance variation.

In such a case, the converter 24 is often referred to as PTC converter. The acronym PTC stands for "Positive Temperature Coefficient".

The converter 24 is then a device whose resistance varies with the temperature.

According to the described example, the converter 24 is a thermistor.

A thermistor has a relatively significant variation in the resistance based on the temperature, this variation being able to be fairly irregular or sudden, in a narrow temperature range (typically between 0° C. and 100° C.).

The thermistor is for example made from metal oxide or a composite material.

Alternatively, the converter 24 is a thermoresistance.

The thermoresistance has a regular increase in the resistivity of certain metals (silver, copper, nickel, gold, platinum, tungsten, titanium) with the temperature increase.

The cooling module 26 includes two faces 28 and 30.

The first face 28 is at a first temperature $T_1$.

The first face 28 is in contact with the component 14.

More specifically, in the example of FIG. 2, the first face 28 is in contact with the sensor 18.

To facilitate the control of the temperature of the sensor 18, the first face 28 has a surface, all of which is in contact with the sensor 18.

The second face 30 is at a second temperature $T_2$.

The second face 30 has a surface the same size as the surface of the first face 28.

According to the described example, the second face 30 is arranged to be kept at a constant temperature.

As an illustration, the second face 30 is in contact with the converter 24.

According to the example of FIG. 2, the converter 24 has a face whereof the surface is the same size as the surface of the second face 30.

The difference between the first temperature $T_1$ and the second temperature $T_2$ depends on the current supplying the cooling module 26.

The function depends on multiple parameters, such as the materials used to make the cooling module 26 or the amplitude of the supply current.

The function is preferably an increasing function.

In practice, the difference between the first temperature $T_1$ and the second temperature $T_2$ is greater than 30° C. in absolute value, preferably greater than 40° C.

When the difference between the first temperature $T_1$ and the second temperature $T_2$ depends on the current supplying the cooling module 26, the cooling module 26 is called a Peltier module, since the cooling module 26 uses the Peltier effect.

Figure 3:
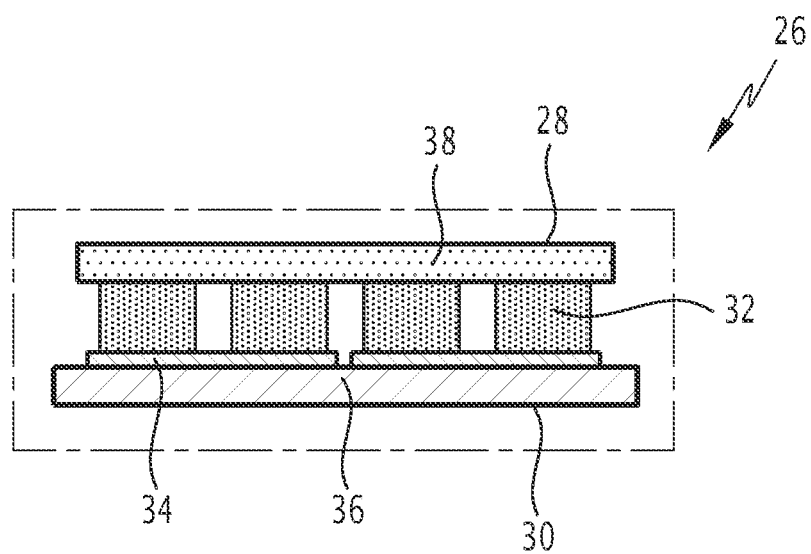
FIG. 3, a schematic view of an example cooling module.

An example of such a cooling module 26 is shown in more detail in the sectional view of FIG. 3.

In the illustrated example, the cooling module 26 includes a lower plate 36, an upper plate 38, junctions 32 and conductive tracks 34.

The lower plate 36 is the plate bearing the second face 30 and the upper plate 38 is the plate bearing the first face 28.

Four junctions 32 are in contact with the upper plate 38.

Each junction 32 is a p-n junction.

In semiconductor physics, a p-n junction refers to a zone of the crystal where the doping varies abruptly, going from p doping to n doping. When the p doped region is placed in contact with the n region, the electrons and the holes spontaneously diffuse on either side of the junction, thus creating a depletion zone where the free carrier concentration is practically zero. The operation of a diode is thus obtained.

Thus, the movement of the electrodes in each junction 32 acts as a heat transfer fluid in a thermal compressor.

As a result, the junctions 32 are arranged spatially to be in thermal contact over a large part (more than 70%) of the upper plate 38.

In the illustrated example. the junctions 32 are evenly distributed over the first face 28 to provide homogeneous cooling of the upper plate 38.

The conductive tracks 34 are in contact with the lower plate 36.

Furthermore, in the illustrated example, there are two conductive tracks 34 and they are in contact with two respective junctions 32.

The cooling module 26 is supplied with constant current by the power supply 22 via the first link 25A. The power consumed by the cooling module 26 is constant.

During operation, when the temperature varies, for example because the platform 10 is in flight if it involves an airplane, the resistance of the converter 24 varies.

For example, when the temperature increases, the resistance of the converter 24 increases.

As a result, the current supplying the converter 24 decreases when the ambient temperature increases, and the converter 24 keeps itself at a constant temperature. The second face 30 of the cooling module 26 is thus kept at a constant temperature.

The cooling module 26 is powered by a fixed electrical power such that the temperature deviation between the first face 28 and the second face 30 is constant at all times. The second face 30 being kept at a fixed temperature and the temperature deviation between the two faces 28 and 30 being fixed, the first face 28 is kept at a constant temperature. Since the temperature varies, the resistance of the converter 24 varies, and therefore its consumed electrical power varies such that the first face 28 maintains a constant temperature.

Reciprocally, when the temperature decreases, the resistance of the converter 24 decreases.

As a result, the current supplying the converter 24 is increased such that the second face 30 is kept at an identical temperature. The deviation between the first temperature $T_1$ and the second temperature $T_2$ remaining fixed and the cooling module 24 always being supplied at a constant power, the first temperature $T_1$ remains fixed.

This makes it possible to obtain a self-regulation of the temperature of the sensor 18 of the component 14.

The control device 16 makes it possible to avoid the bias related to the temperature in the measurement of the sensor 18.

In other words, using the control device 16 makes it possible to keep the performance and reliability of the electronic system 12 during the operation of the platform 10.

Relative to a thermistor alone keeping the temperature of the sensor 18 at a high temperature, the increased reliability of the sensor 18 in this context comes from the fact that the cooling module 26 make sure that the operating temperature of the sensor 18 is lower.

This relatively low temperature is obtained without any regulating electronics of the temperature being involved, such that the control device 16 is less expensive and does not affect the reliability and bulk of the electronic system 12.

Figure 4:
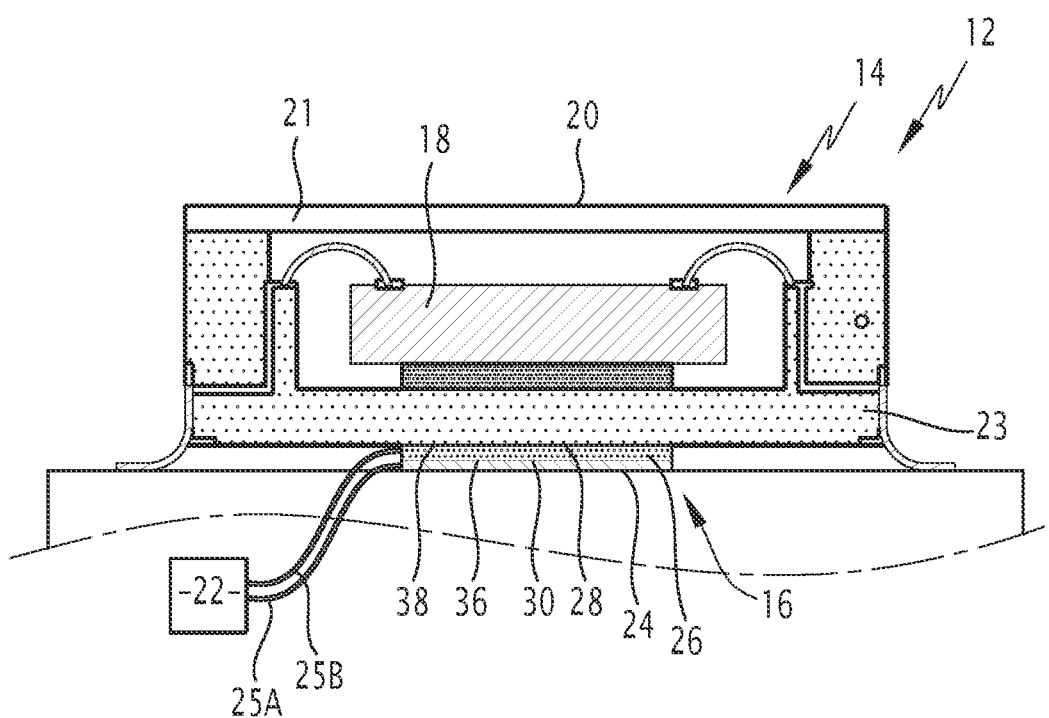
FIG. 4, an illustration of another example electronic system.

Another embodiment is shown in FIG. 4.

The same remarks apply for the embodiment of FIG. 4 as for the embodiment of FIG. 2, such that they are not repeated hereinafter. Only the differences are outlined below.

In this case, instead of being in contact with the sensor 18, the first face 28 is in contact with the base 23.

During operation, when the temperature varies, for example because the platform 10 is in flight if it involves an airplane, the resistance of the converter 24 varies.

For example, when the temperature increases, the resistance of the converter 24 increases.

As a result, the current supplying the converter 24 is decreased such that the temperature of the second face 30 is kept fixed. The difference between the first temperature $T_1$ and the second temperature $T_2$ remains constant, the first temperature T1 remaining constant.

This cools the base 23, which, by thermal conduction, also cools the sensor 18.

The same advantages as for the embodiment of FIG. 2 then apply for the embodiment of FIG. 4, such that they are not repeated.

According to one alternative, the cooling module 26 includes a ceramic support, the converter 24 being the support.

This makes it possible to gain compactness.

According to another alternative, the converter 24 is able to convert a temperature increase into a resistance increase.

Preferably, the converter 24 and the faces 28 and 30 of the cooling module 26 are each made from ceramic. More specifically, the expression "the faces 28 and 30 are made from ceramic" means that the lower 36 and upper 38 plates are made from ceramic.

Advantageously, the second face 30 (i.e., the lower plate 36) is made from a ceramic of the PTC type. By definition, a PTC ceramic is a ceramic able to convert a temperature variation into a resistance variation. In such an embodiment, the second face 30 also acts as a converter 24.

This makes the control device 16 even easier to produce.

Additionally or optionally, the power supply 22 is a voltage generator.

In general, the cooling module 26, the converter 24 and the power supply 22 are arranged electrically so that the current supplying the converter 24 decreases with a temperature increase and the current supplying the cooling module 26 remains constant.

In other words, the value of the current supplying the cooling module 26 does not vary with time.

In addition, the thermal control device 26 makes it possible to avoid active temperature control.

The invention relates to the combination of all technically possible embodiments.

The invention claimed is:

1. A thermal control device of a component, the thermal control device including:
   a power source,
   a converter able to convert a temperature variation into a resistance variation,
   a cooling module including two faces, a first face at a first temperature and a second face at a second temperature, the difference between the first temperature and the second temperature depending on the current supplying the cooling module, the first face being in contact with the component,
   wherein the cooling module, the converter and the power source are connected electrically so that the current supplying the converter decreases with an ambient temperature increase and the current supplying the cooling module remains constant all the time, and
   wherein the second face of the cooling module is in physical and thermal contact with the converter so that the second face is kept at a constant temperature.

2. The thermal control device according to claim 1, wherein the cooling module and the converter are arranged in parallel with the power supply.

3. The thermal control device according to claim 1, wherein the converter has a resistance that increases with the temperature.

4. The thermal control device according to claim 1, wherein the control device is a self-regulated device.

5. The thermal control device according to claim 1, wherein the component includes a sensor and a protective housing, the first face being in contact with the sensor or the housing.

6. The thermal control device according to claim 1, wherein the converter and the faces of the cooling module are each made from ceramic.

7. The thermal control device according to claim 6, wherein the second face is made from ceramic of the Positive Temperature Coefficient (PTC) type.

8. The thermal control device according to claim 5, wherein the sensor is a micro-electromechanical system.

9. An electronic system including:
   the component, and
   a thermal control device of the component, the control device being according to claim 1.

10. A platform including an electronic system according to claim 9.

11. A thermal control device of a component, the thermal control device including: a power source capable of delivering a current,
   a converter able to convert a temperature variation into a resistance variation, the converter being electrically connected to the power source via a first link,
   a cooling module including two faces, a first face at a first temperature and a second face at a second temperature, the difference between the first temperature and the second temperature depending on the current supplying the cooling module, the first face being in contact with the component, wherein the cooling module is connected to the power source via a second link and is powered by the power source with a fixed current which is the same all the time such that the deviation between the first temperature of the first face and the second temperature of the second face is fixed, wherein the converter is powered by the power source with a current which decreases with an ambient temperature increase, and wherein the second face of the cooling module is in physical and thermal contact with the converter so that the second temperature of the second face of the cooling module is kept at a constant temperature.

* * * * *